United States Patent
Yang et al.

(10) Patent No.: US 6,728,160 B1
(45) Date of Patent: Apr. 27, 2004

(54) PATH GATE DRIVER CIRCUIT

(75) Inventors: Tien-Chun Yang, San Jose, CA (US); Kurihara Kazuhiro, Sunnyvale, CA (US); Pau-Ling Chen, Saratoga, CA (US)

(73) Assignees: Advanced Micro Devices, Inc., Sunnyvale, CA (US); Fujitsu Limited, Kanagawa-Ken (JP)

( * ) Notice: Subject to any disclaimer, the term of this patent is extended or adjusted under 35 U.S.C. 154(b) by 0 days.

(21) Appl. No.: 10/243,433

(22) Filed: Sep. 12, 2002

(51) Int. Cl.[7] .................................................. G11C 8/00
(52) U.S. Cl. ........................... 365/230.06; 365/189.05; 365/189.11
(58) Field of Search ...................... 365/230.06, 189.11, 365/189.05

(56) References Cited

U.S. PATENT DOCUMENTS

| | | | | |
|---|---|---|---|---|
| 5,202,855 A | * | 4/1993 | Morton | 365/226 |
| 5,646,898 A | * | 7/1997 | Manning | 365/205 |
| 6,330,196 B1 | * | 12/2001 | Protzman | 365/189.11 |

* cited by examiner

Primary Examiner—Van Thu Nguyen
Assistant Examiner—Pho M. Luu

(57) ABSTRACT

A path gate driver circuit of the present invention includes a shunt stage, a level shifter stage, a pull-up stage, and an output stage. The shunt stage has a control terminal coupled to a supply, and an input terminal coupled to a control signal path. The level shifter stage has a first control terminal coupled to the control signal path, a second control terminal coupled to an output terminal of the shunt stage, a first input terminal coupled to a boost-low supply, and a second input terminal coupled to a boost-high supply. The pull-up stage has a control terminal coupled to an output terminal of the level shifter stage, and an input terminal coupled to the boost-high supply. The output stage has a first control terminal coupled to the output terminal of the shunt stage and an output terminal of the pull-up stage, a second control terminal coupled to the control signal path a first input terminal coupled to the boost-low supply, and a second input terminal coupled to the boost-high supply. A boosted control signal is provided at the output terminal of the output stage in response to the control.

25 Claims, 6 Drawing Sheets

PATH GATE DRIVER CIRCUIT

FIELD OF THE INVENTION

Embodiments of the present invention relate to memory devices, and more particularly to memory device decoder circuits.

BACKGROUND OF THE INVENTION

Prior art FIG. 1, is a diagram of a memory device with an associated decoder circuit. As depicted in FIG. 1, the memory device comprises a plurality of memory cells (MC) 110 arranged in rows and columns. The memory cells in a row share a common wordline 120 connection; while memory cells in a column share a common bitline 130 connection. Signals are applied to the word line and bit line to selectively read, write, and erase one or more desired memory cells in the array.

A decoder circuit is connected to each bitline. For purposes of clarity, however, only a single decoder circuit connected to a single bitline is shown. The decoder circuit may include a decoder circuit, which comprises a path gate 140 coupling the bit line 130 to a sense amplifier 150. The sense amplifier 150 detects a signal on the bitline and outputs a signal, indicative of the programming state of the selected memory cell, to a data buffer 160.

As semiconductor memory technology progresses, increasing read margins becomes critical. Increasing read margins can be achieved by reducing voltage losses across the read circuit.

Currently, one or more path gates 140 are utilized in the decoder circuitry of memory devices. The path gate is used to selectively couple a bitline to a sense amplifier. The path gate is typically a metal oxide silicon field effect transistor (MOSFET), having a gate (G), a drain (D) and a source (S) terminal. When the path gate 140 is off, there is no conducting channel between the source and drain terminals. When the path gate 140 is on, a conducting channel, having a small resistance, is induced. Thus, the path gate 140 introduces a signal loss on the selected bitline 130.

The channel resistance can be reduced, and the read margin increased, by utilizing a boosted control signal. The boosted control signal is approximately two or three times the supply voltage (Vcc) in the high state, and approximately 0V in the low state. The boosted control signal is coupled to the gate terminal of the path gate. The increased gate voltage acts to reduce the channel resistance across the path gate (i.e. between the drain and source terminals).

The boosted control signal is provided by a path gate driver circuit 170 (hereinafter referred to a driver circuit). Referring now FIG. 2, a diagram of a driver circuit 170 in accordance with the prior art is shown. The driver circuit 170 typically has an output stage comprising a pair of transistors. A first transistor 210 provides a pull-up to a boost-high supply (6.5V). A second transistor 220 provides a pull-down to a boost-low supply (ground). When the control signal is in a low state (0V), the pull-down transistor 220 of the output stage is off, and the pull-up transistor 210 of the output stage is on. Therefore, the output of the driver circuit is high (6.5V). When the control signal switches to a high state (3V), the pull-down transistor 220 of the output stage turns on. However, the pull-up transistor 210 does not turn completely off, because the control signal (3V) is less than the boost-high voltage (6.5V). Therefore, the pull-down transistor 220 has to sink the current flowing in the pull-up transistor 210. The current results in a voltage drop across the channel resistance of the pull-down transistor 220. Thus, the output stage of the current driver circuit cannot provide a boost-low output voltage of 0V. The introduced voltage drop across the channel resistance results in a low output voltage of approximately 2V–3V. Furthermore, the low output voltage level (2V–3V) is greater than the threshold voltage of the path gate transistor. Therefore, the path gate transistor 140 will not be completely turned off. The resulting current flow increases the power consumption in the decoder circuit.

The channel resistance in the pull-down transistor 220 of the driver circuit 170 also affects the switching time constant of the path gate 140. The channel resistance of the output stage affects the time constant associated with discharging the path gate's 140 gate capacitance. The higher the channel resistance of the output stage of the driver circuit 170, the longer it takes to discharge the gate capacitance of the path gate 140.

Thus, the prior art suffers from the fact that the pull-up of the output stage of the path gate driver circuit does not completely turn off. The prior art is therefore disadvantageous in that the boosted control signal is not substantially 0V when in a low state. As a result, the prior art is disadvantageous because of the path gate resistance. The prior art is also disadvantageous because of the path gate switching time.

SUMMARY OF THE INVENTION

An improved driver circuit is disclosed. In one embodiment, the driver circuit includes a shunt stage, a level shifter stage, a pull-up stage, and an output stage. The shunt stage has a control terminal coupled to a supply, and an input terminal coupled to a control signal path. The level shifter stage has a first control terminal coupled to the control signal path, a second control terminal coupled to an output terminal of the shunt stage, a first input terminal coupled to a boost-low supply, and a second input terminal coupled to a boost-high supply. The pull-up stage has a control terminal coupled to an output terminal of the level shifter stage, and an input terminal coupled to the boost-high supply. The output stage has a first control terminal coupled to the output terminal of the shunt stage and an output terminal of the pull-up stage, a second control terminal coupled to the control signal path, a first input terminal coupled to the boost-low supply, and a second input terminal coupled to the boost-high supply. A boosted control signal is thereby provided at the output terminal of the output stage in response to the control signal.

BRIEF DESCRIPTION OF THE DRAWINGS

The present invention is illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instailces, well-known methods, procedures, components, and circuits have not been described in detail as not to unnecessarily obscure aspects of the present invention.

Figure 1:
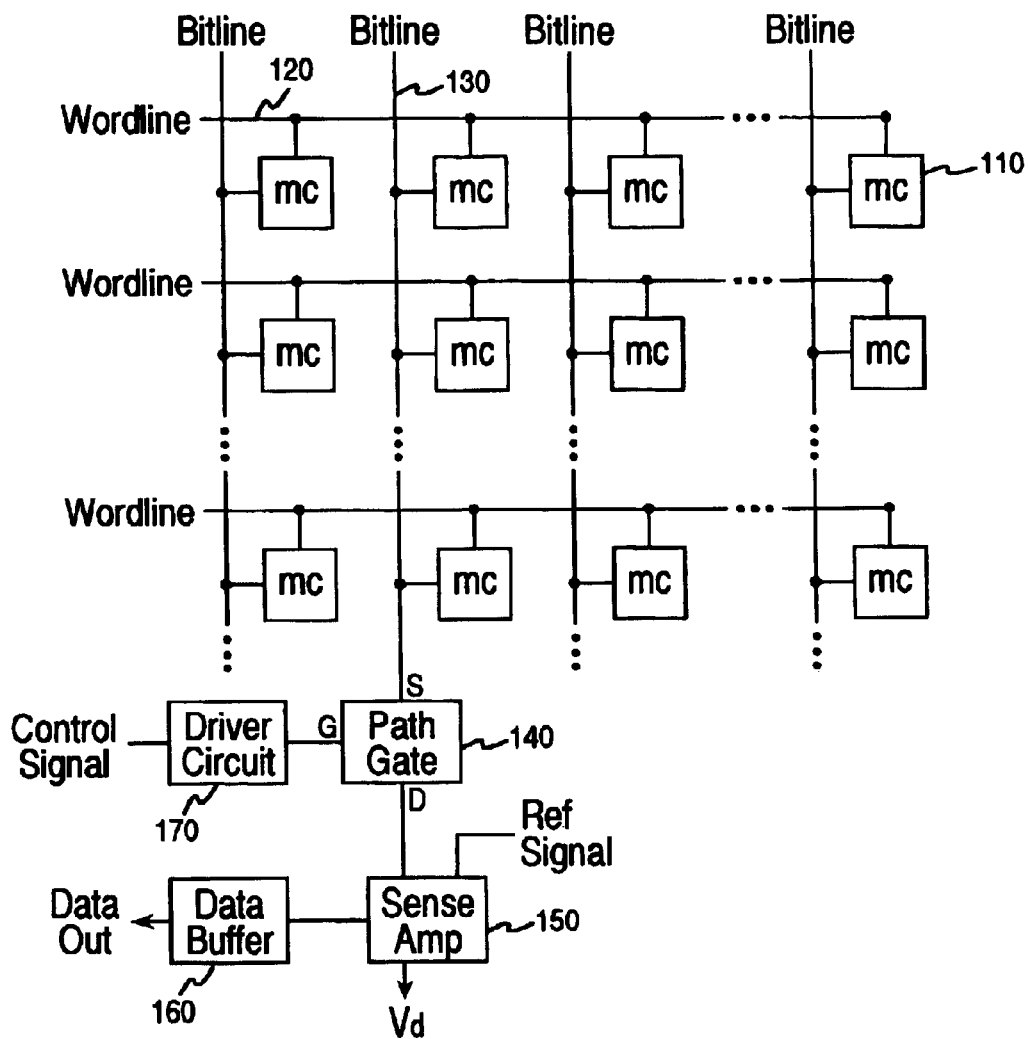
FIG. 1 shows a prior art diagram of a memory device with an associated decoder circuit.
Figure 2:
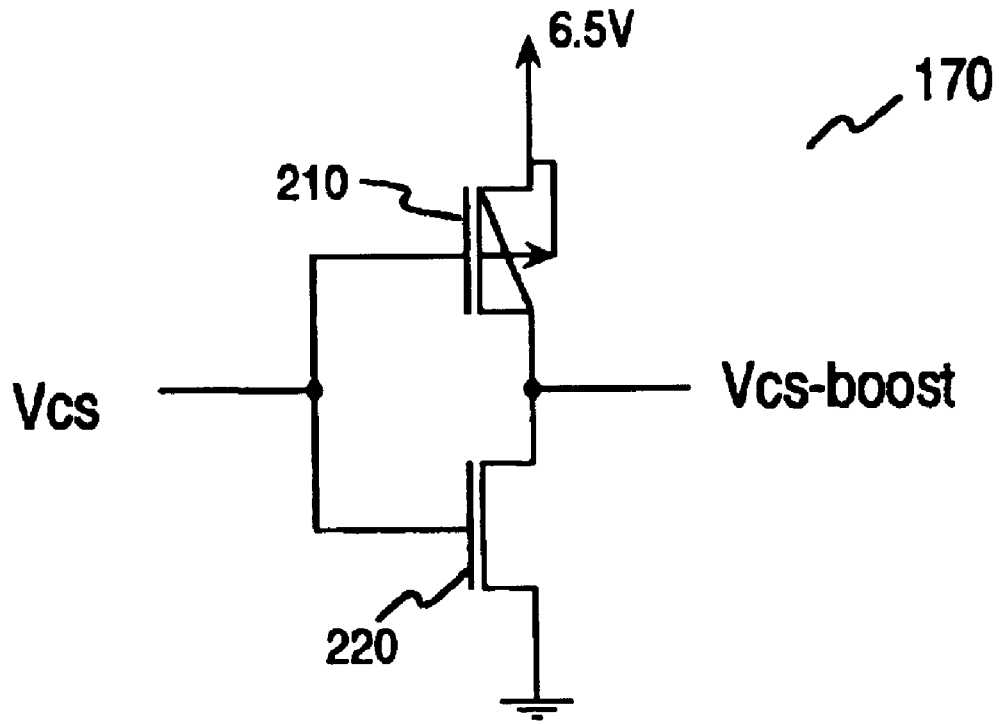
FIG. 2 shows a prior art diagram of a path gate driver circuit.
Figure 3:
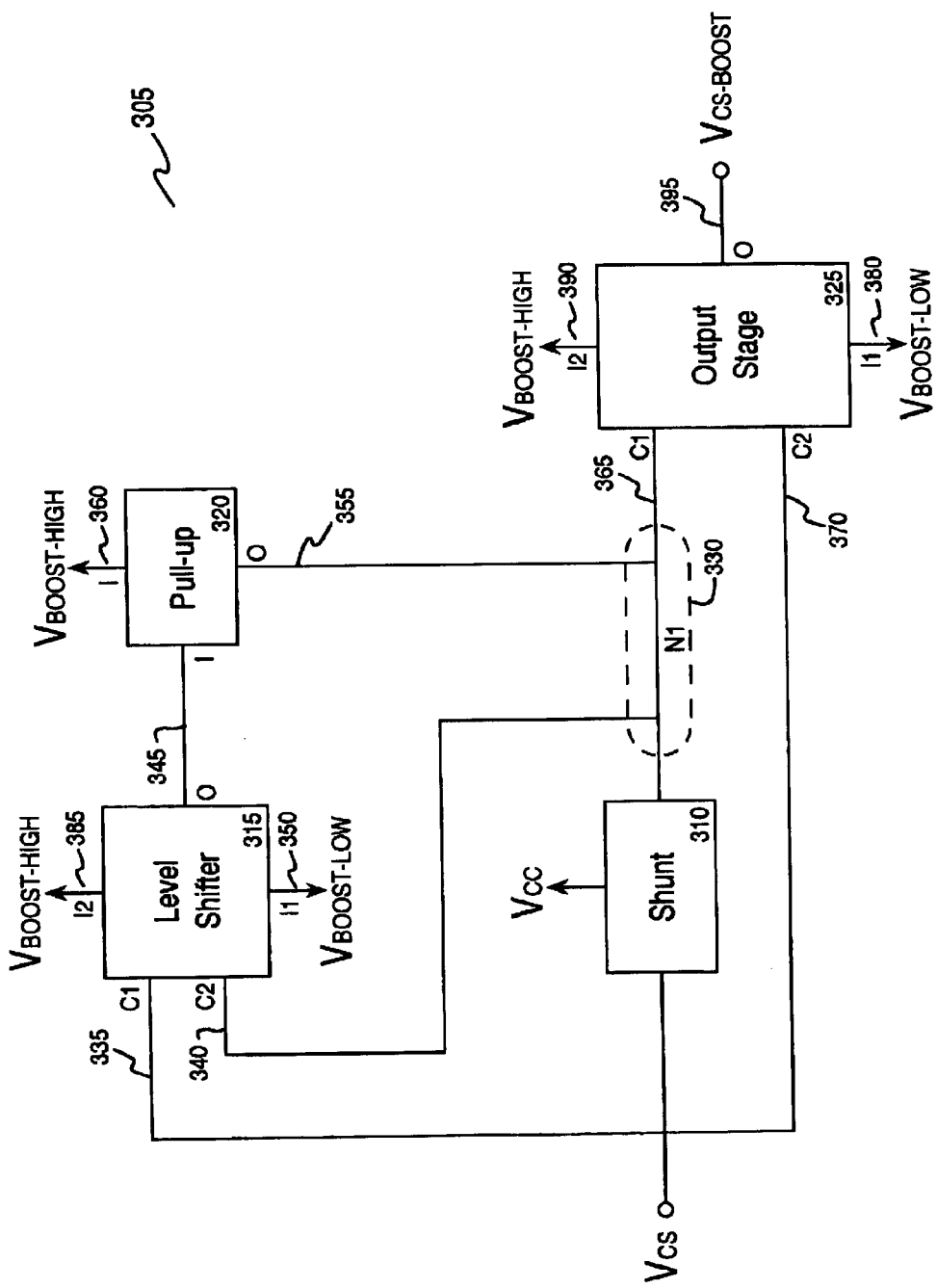
FIG. 3 shows a diagram of a path gate driver circuit in accordance with one embodiment of the present invention.

Referring now to FIG. 3, a diagram of a path gate driver circuit 305 in accordance with one embodiment of the present invention is shown. As depicted in FIG. 3, the driver circuit 305 receives a control signal (Vcs) and provides a boosted control signal (Vcs-boost). The driver circuit 305 comprises a shunt 310, a level shifter 315, a pull-up 320, and an output stage 325. The shunt 310 is coupled to the control signal (Vcs) path, a supply (Vcc), and a node N1. The level shifter 315 is coupled to the control signal (Vcs) path, node N1, a boost-high supply (Vboost-high), a boost-low supply (Vboost-low), and the pull-up 320. The pull-tip 320 is coupled to the level shifter 315, the boost-high supply (Vboost-high), and node N1. The output stage 325 is coupled to the node N1, the control signal (Vcs), the boost-high supply (Vboost-high), the boost-low supply, and the output boosted control signal (Vcs-boost) path.

The control signal (Vcs) has a high state (Vcs+) and a low state (Vcs−). When the control signal is in the high state, the shunt 310 passes Vcs+ to node N1 330. The level shift 315 receives a high state (Vcs+) on a first control line 335 from the control signal and a high state (Vcs+) on a second control line 340 from the node N1 330. The high state applied to both control lines 335, 340 of the level shifter 315 cause an output line 345 of the level shift 315 to be a low state (Vboost-low). The low state (Vboost-low) is supplied by a first input line 350 of the level shifter 315.

The low state (Vboost-low) output at the level shifter 315 is coupled to a control line 345 of the pull-up 320. The low state (Vboost-low) appearing on the control line 345 of the pull-up 320 causes an output line 355 of the pull-up 320 to go to a high state (Vboost-high). The high state (Vboost-high) is supplied by an input line 360 of the pull-up 320. The output line 355 of the pull-up 320 passes the high state (Vboost-high) to node N1 330.

The control lines 35, 340 of the level shifter 315 remain in a high state (Vcs+ and Vboost-high), and therefore the output line 345 of the level shifter 315 remains in a low state.

The high state (Vboost-high) from the output line 355 of the pull-up 320 appears at a first control line 365 of the output stage 325; and a high state (Vcs+) from the control signal appears at a second control line 370 of the output stage 320. The high state applied to both control lines 365, 370 of the output stage 325 cause an output line 375 of the output stage 325 to be a low state (Vboost-low). The low state (Vboost-low) is supplied by a first input line 380 of the output stage 325.

When the control signal switches to a low state, the level shifter receives 315 the low state (Vcs−) on the first control line 335 and the high state (Vcs+) from node N1 330 on the second control line 340. Therefore the output line 345 of the level shifter 315 switches to a high state (Vboost-high). The high state (Vboost-high) is supplied by a second input line 385 of the level shifter 315.

The high state (Vboost-high) on the output line 345 of the level shifter 315 is coupled to the control line 345 of the pull-up 320. The high state (Vboost-high) appearing on the control line 345 of the pull-up 320 causes the output line 355 of the pull-up 320 to go to a tri-state. The tri-state present on the output line 355 of the pull-up 320 allows the shunt 310 to pull node N1 330 to a low state (Vcs−), by passing the low state of the control signal.

Furthermore, the second control line 340 of the level shifter 315 goes to a low state (Vcs−), and the output line 345 of the level shifter 315 remains in a high state.

The low state (Vcs−) present at Node N1 330 is coupled to the first control line 365 of the output stage 325. Therefore, a low state (Vcs−) from node N1 330 appears at a first control line 365 and a low state (Vcs−) from the control signal appears at the second control line 370 of the output stage 325. The low states applied to both control lines 365, 370 of the output stage 325 cause an output line 375 of the output stage 325 to be a high state (Vboost-high). The high state on the output line 375 of the output stage 325 is supplied by a second input line 390 of the output stage 325.

The output stage 325 causes only one input line 380, 390 to be coupled to the output line 375 depending upon the state of the control signal. When the control signal is in a low state (Vcs−), the output line 375 is coupled to the Vboost-high supplied on the second input line 390 of the output stage 325; while the Vboost-low supplied on the first input line 380 is isolated. Thus, there is no partial conducting of the Vboost-low by the output stage 325. When the control signal is in a high state (Vcs+), the output line 375 is coupled to the Vboost-low supplied on the first input line 380 of the output stage 325; while the Vboost-high supplied on the second input 390 is isolated. Thus, there is no partial conducting of the Vboost-high signal by the output stage 325.

Figure 4:
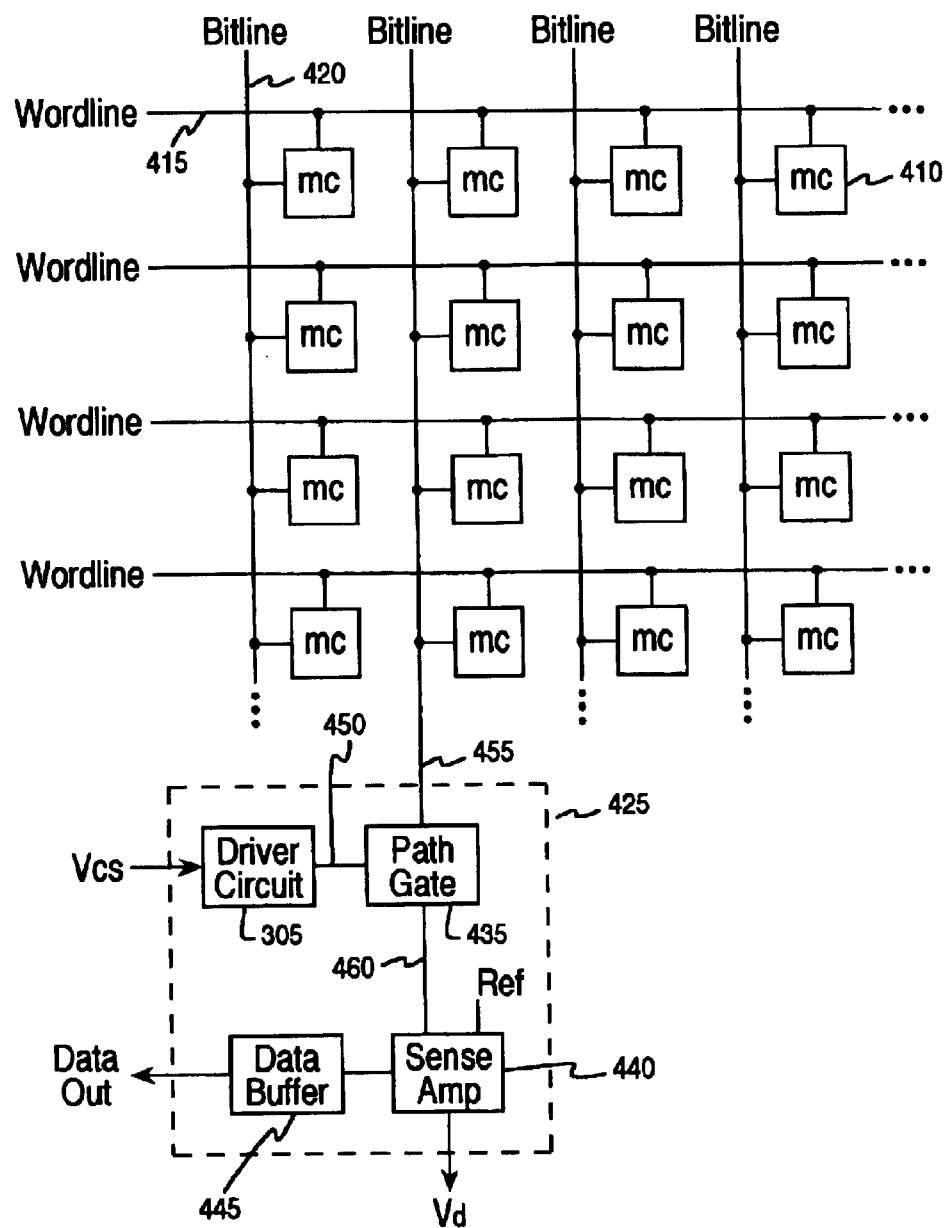
FIG. 4 shows a diagram of a memory device in accordance with one embodiment of the present invention.

Referring now to FIG. 4, a diagram of a memory device in accordance with one embodiment of the present invention is shown. As depicted in FIG. 4, the memory device comprises a plurality of memory cells (MC) 410 (e.g. floating gate MOSFET transistors, or the like) arranged in rows and columns. The memory cells in a row share a common wordline 415 connection; while memory cells in a column share a common bitline 420 connections. A decoder circuit 425 is connected to each bitline 420 (although only one is illustrated for purposes of conciseness). The decoder circuit 425 comprises a driver circuit 305 in accordance with the present invention, a path gate 435, a sense amplifier 440, and a data buffer 445.

The path gate 435 and a control signal are used to selectively couple a read drain voltage (Vd) and the sense amplifier 440 to the desired bitline 420. The sense amplifier 440 compares the signal level on the bitline 420 to a reference signal, and outputs a signal to the data buffer 445 representing the state of the selected memory cell 410. The driver circuit 305 drives the path gate 435. The driver circuit 305 receives a control signal (Vcs), and provides a corresponding boosted control signal for controlling the path gate 435.

In an exemplary read mode, a read gate voltage (Vg) is applied to a corresponding wordline 415. The read drain voltage (Vd) is applied to the corresponding bitline 420. The resulting signal on the bitline 420 represents the state of the selected memory cell 410.

The path gate 435 is comprised of a control terminal 450, an input terminal 455 and an output terminal 460. The input 455 and output 460 terminal of the path gate 435 selectively couple the signal on the bitline 420 to the sense amplifier 440. The boosted control signal, applied to the control terminal 450 of the path gate 435, acts to provide a conducting channel between the input 455 and output 460 terminals such that the signal on the bitline 420 is passed between the input 455 and output 460 terminals in one state of the control signal; and acts to isolate the input 455 and output 460 terminals such that the signal on the bitline 420 is blocked between the input 455 and output 460 terminals in a second state of the control signal.

The boosted high control signal is applied to the control terminal 450 of the path gate 435 to select the bitline 420 and reduce the signal drop across the input 455 and output 460 terminal of the path gate 435. The reduced signal drop across the input 455 and output 460 terminal of the path gate 435 acts to increase the read margin of the signal on the bitline 420. The read margin is the difference in signal level between the memory cell in a programmed state, and the memory cell in a non-programmed state.

The boosted low control signal is applied to the control terminal 450 to de-select the bitline 420. Thereby, power consumption is reduced, and the path gate 435 switching speed is also reduced.

Thus, the driver circuit 305 of the present invention provides a level shifter able to efficiently switch at a high voltage. The efficient high voltage level shifter is used to drive the path gate 435, in the decoder circuit 425 of the memory device, at increased switching speeds. Furthermore, the read margin in the memory device is improved at low supply voltages due to the high voltage level shift of the driver circuit 305.

Figure 5:
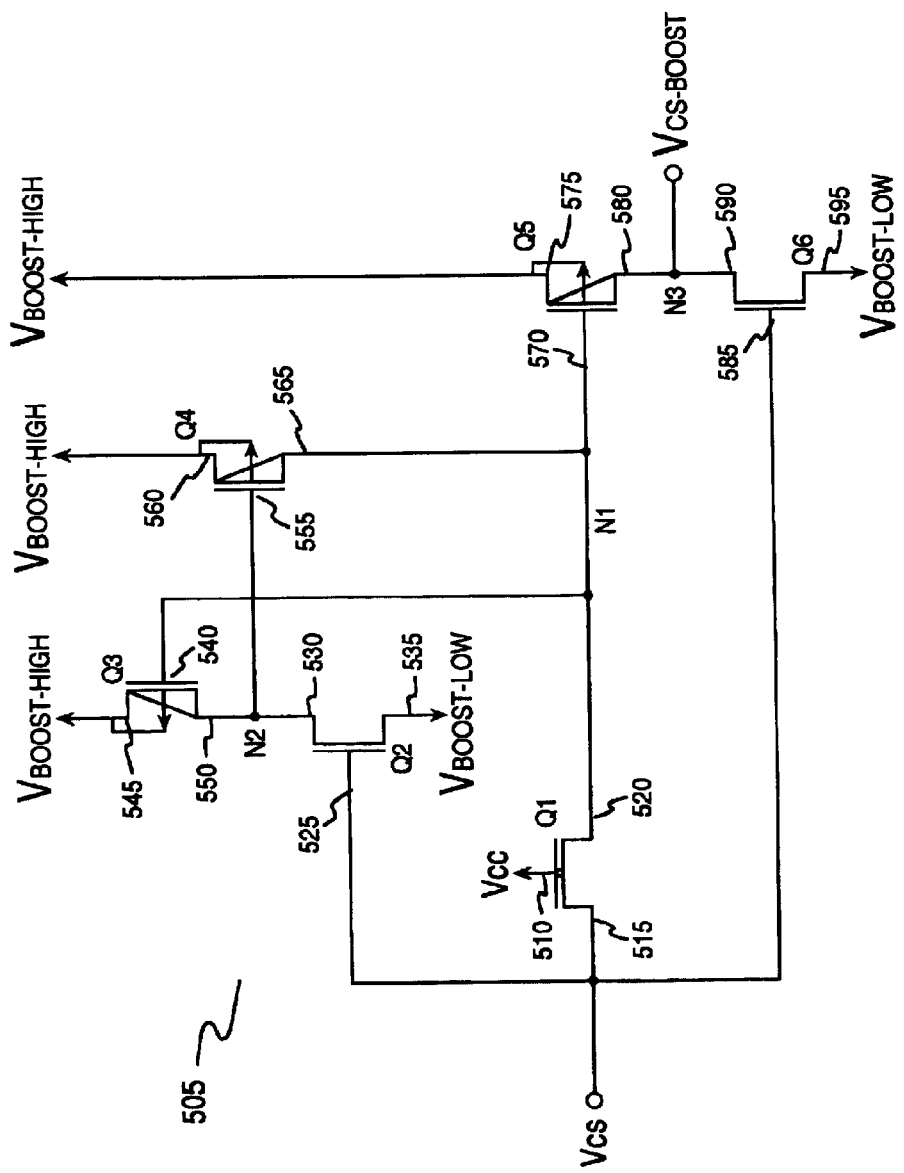
FIG. 5 shows a diagram of a driver circuit in accordance with one embodiment of the present invention.

Referring now to FIG. 5, a diagram of a driver circuit 505 in accordance with one embodiment of the present invention is shown. As depicted in FIG. 5, the driver circuit 505 receives a control signal (Vcs) and provides a boosted control signal (Vcs-boost). The driver circuit 505 comprises a first switching element (Q1), a second switching element (Q2), a third switching element (Q3), a forth switching element (Q4), a fifth switching element (Q5), and a sixth switching element (Q6).

The first switching element (Q1) has a control (gate) terminal 510 coupled to a supply (Vcc), an input (drain) terminal 515 coupled to the control signal (Vcs) path, and an output (source) terminal 520 coupled to a node N1.

The second switching element (Q2) has a control (gate) terminal 525 coupled to the control signal (Vcs) path, an output (drain) terminal 530, and an input (source) terminal 535 coupled to a boost-low supply (Vboost-low). The third switching element (Q3) has a control (gate) terminal 540 coupled the node N1, an input (source) terminal 545 coupled to a boost-high supply (Vboost-high), and an output (drain) terminal 550.

The forth switching element (Q4) has a control (gate) terminal 555 coupled to the output terminals 530, 550 of the second and third switching elements (Q2, Q3), an input (source) terminal 560 coupled to the boost-high supply (Vboost-high), and an output (drain) terminal 565 coupled to the node N1.

The fifth switching element (Q5) has a control (gate) terminal 570 coupled to the node N1, an input (source) terminal 575 coupled to the boost-high supply (Vboost-high), and an output (drain) terminal 580. The sixth switching element (Q6) has a control (gate) terminal 585 coupled to the control signal (Vcs) path, an output (drain) terminal 590, and an input (source) terminal 595 coupled to the boost-low supply (Vboost-low). The boosted control signal (Vcs-boost) is provided on the output terminals 580, 590 of the fifth and sixth switching elements (Q5, Q6), which are coupled together.

In an exemplary implementation of the above-described embodiment, the switching elements Q1, Q2, and Q6 are n-type MOSFET transistors, and switching elements Q3, Q4, and Q5 are p-type MOSFET transistors. Furthermore, the control signal has a high state of 3 volts (V) and a low state of 0V; the boost-high supply (Vboost-high) is 6.5V; the boost-low supply (Vboost-low) is 0V; and the supply signal (Vcc) is 3V. Operation of the present embodiment is described-below with reference to the exemplary implementation.

The gate 510 of Q1 is coupled to 3V, which induces a conducting channel between the drain 515 and source 520 (hereinafter referred to as turned on). Thus, when the control signal is 3V, switching element Q1 passes the control signal to node N1.

The gate 525 of switching element Q2 is also 3V. Therefore, switching element Q2 is turned on, pulling the drain terminal 530 of switching element Q2 down toward 0V.

The voltage at the drain terminal 530 of switching element Q2, 0V, appears at the gate terminal 555 of switching element Q4. Therefore, switching element Q4 is turned on, pulling the drain terminal 565 of Q4 up toward 6.5V. Thus, the voltage at node N1 raises from 3V to 6.5V. As a result, the gate 540 of switching element Q3 also raises from 3V to 6.5V. The gate 540 voltage of 6.5V on switching element Q3 causes no conducting channel to be present between the drain 550 and source 545 (hereinafter referred to as turned off).

Furthermore, the voltage of 6.5V on node N1 also turns off switching element Q5. While, the gate terminal 585 of switching element Q6 is coupled to 3V, which turns on Q6 causing the drain 590 of Q6 to be pulled down toward 0V. Thus, the boosted control signal (Vcs-boost) is 0V (i.e. low state) when the control (Vcs) signal is 3V (i.e. high state).

Similarly, when the control signal is 0V (Dow state), the voltage at node N1 is 0V. Furthermore, when the control signal is 0V, switching element Q2 is turned off. The voltage at node N1 appears at the gate 540 of switching element Q3. Therefore, switching element Q3 is turned on and the voltage at the drain terminal 550 is pulled up to 6.5V.

The voltage of 6.5V at the drain terminal 550 of switching element Q3 appears at the gate terminal 555 of switching element Q4. Therefore, switching element Q4 is turned off, such that node N1 remains at 0V.

Furthermore, the voltage of 0V on node N1 also turns on switching element Q5, pulling the drain terminal 580 up toward 6.5V. While, switching element Q6 is turned off because the control signal voltage of 3V is applied to its gate terminal 585. Thus, the boosted control signal (Vcs-boost) is 6.5V (i.e. high state) when the control signal is 0V (i.e. low state).

The switching speed and stability of the driver circuit 505 can be optimized by adjusting the relative channel width and lengths of the respective MOSFET transistors. A shorter channel length and/or wider channel width results in a lower drain to source resistance (i.e. channel resistance). Lower channel resistance is considered to be a characteristic of a strong MOSFET transistor. Furthermore, the mobility of majority charge carriers (electrons) in n-type MOSFET devices is greater than the mobility of majority charge carriers (holes) in p-type MOSFET devices. The increased majority carrier mobility is also considered to be a characteristic of a strong MOSIFET transistor.

In an exemplary embodiment, the Q5 and Q6 transistors of the output stage are designed to have channel width to length ratios optimized for driving path gates. However, the Q6 transistor is inherently stronger than the Q5 transistor because of majority carrier mobility. Thus, when the output boosted control signal switches from a high state to a low state, the Q6 transistor can quickly sink the current still flowing in Q5, providing a quick and complete transition to the low state. The strong pull-down characteristic of Q6 will also increase switching speed by quickly discharging the gate capacitance of the path gate transistor.

A quick and complete transition of the output control signal from a high state to a low state is dependent upon Q5 turning off completely as quickly as possible. Therefore, the Q4 transistor is also designed to be strong. A strong, Q4 ensures that when the control signal switches from a low state to a high state, that node N1 raises quickly to Vboost-high. The faster that node N1 raises to Vboost-high, the faster Q5 will turn off completely. The quick raise of the voltage at node N1 also ensures stability of the driver circuit 505.

Furthermore, to cause Q4 to charge node N1 up to Vboost-high, when the control signal switches from a low state to a high state, Q2 should provide a strong pull-down to Vboost-low. Thus, Q2 is stronger than Q3, and along with Q2 inherent strength due to majority carrier mobility, Q2 is able to provide a strong pull-down to Vboost-low. The strong pull-down provided by Q2, provides for quick switching of Q4.

Figure 6:
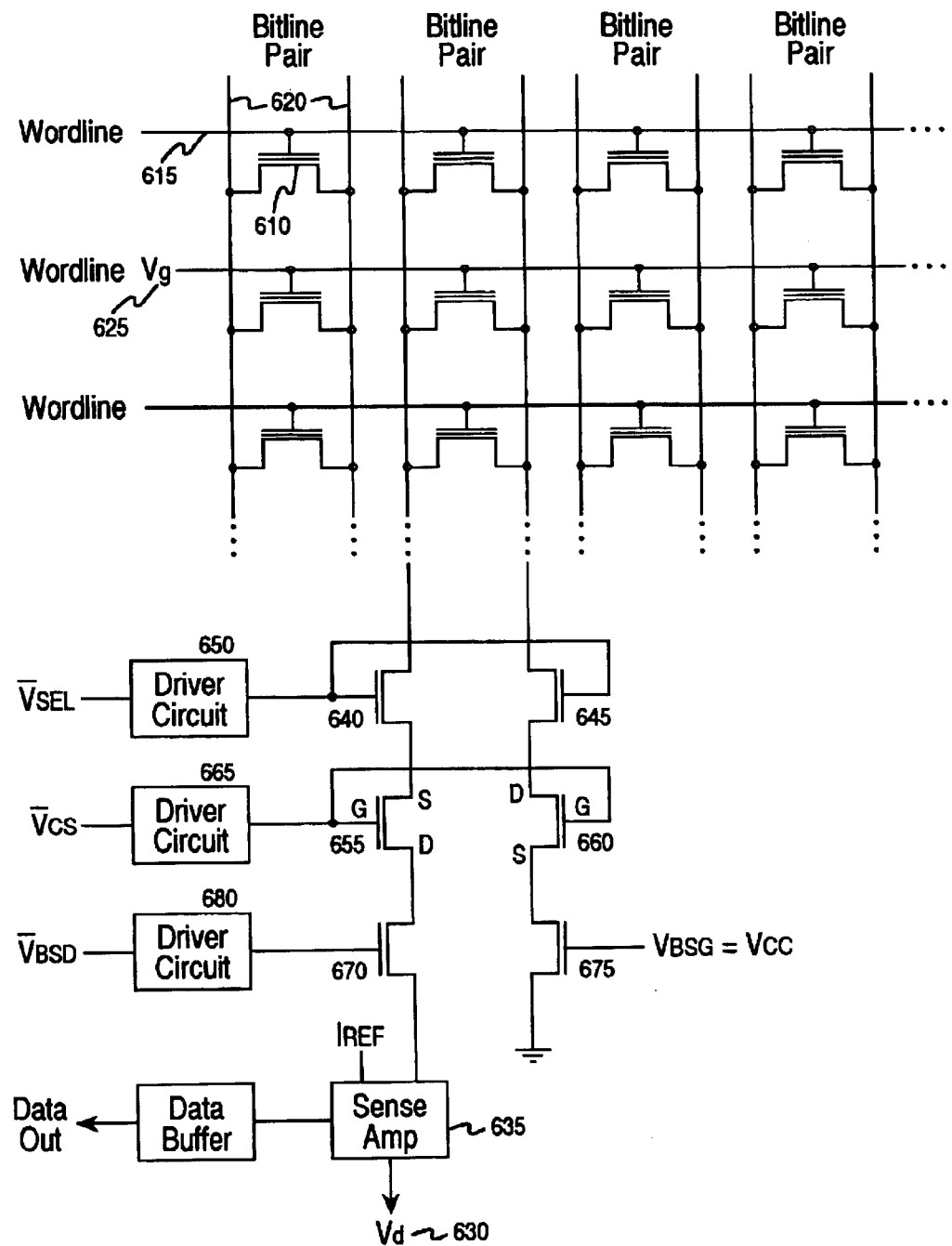
FIG. 6 shows a diagram of a memory device in accordance with one embodiment of the present invention.

Referring now to FIG. 6, a diagram of a memory device in accordance with one embodiment of the present invention is shown. As depicted in FIG. 6, the memory device comprises a plurality of memory cells 610 arranged in rows and columns. The memory cells 610 in a row share a common wordline 615 connection; while memory cells 610 in a column share common bitline pair 620 connections. A decoder circuit is connected to each bitline pair 620 (only one decoder circuit is connected to one bitline pair for purposes of conciseness).

In an exemplary read mode, a read gate voltage (Vg) 625 is applied to a corresponding wordline 615. A read drain voltage (Vd) 630 is applied to the corresponding first bitline of the bitline pair 620. A sense amplifier 635 is used to measure a current on the bitline of the bitline pail 620.

A plurality of path gates 610, 645, 655, 660, 670, 675 and a plurality of control signals (Vsel, Vcs, Vbsd, Vbsg) are used to select the desired bitline pair 620. In an exemplary implementation, the decoder circuit comprises a pair of select gate path gates 640, 645, a corresponding select gate driver circuit 650, a select gate signal (Vsel), a pair of column select path gates 655, 660, a corresponding column select driver circuit 665, a column select signal (Vcs), a byte select for drain path gate 670, a byte select for drain driver circuit 680, a byte select for drain signal (Vbsd), a byte select for ground path gate 675, and a byte select for ground signal (Vbsg). The path gates are MOSFET transistors having a gate (G) terminal, a drain (D) terminal and a source (S) terminal. The drain (D) and source (S) terminals couple the bitline pair to the sense amplifier and read drain voltage (Vd).

Operation of the exemplary read mode of the present invention will be illustrated with respect to the column select path gates 655, 660, the column select driver circuit 665, and the column select signal (Vcs). The operation of the select ,ate path gates 640, 645, byte selected for drain path gate 670, and byte selected for ground path gate 675 is substantially the same, and will not be repeated for the purpose of conciseness.

The column select control signal (Vcs) is applied to the input of the column select driver circuit 665. When the column select control signal (Vcs) is in a high state, the column select driver circuit 665 outputs a low boosted column select control signal. When the column select control signal (Vcs) is in a low state, the column select driver circuit 665 outputs a high boosted column select control signal.

The output of the column select driver circuit 665 is coupled to the gate (G) terminal of the pair of column select path gates 655, 660. When the output of the column select driver circuit 665 is in a boost-high state, conducting channels between the drain (D) and source (S) terminals of the column select path gates 655, 660 are induced, such that the current on the bitline pair 620 is passed between the drain (D) and source (S) terminals of the column select path gates 655, 660. When the output of the column select driver circuit 665 is in a boosted-low state, there is no conducting channel and therefore the path gates 655, 660 acts to block the current flowing on the bitline pair 620.

The boosted-high control signal reduces the drain (D) to source (S) resistance, which in turn reduces the signal drop on the bitline pair, introduced by the column select path gates 655, 660. The reduced signal drop across the source (S) and drain (D) terminals of the column select path gates 655, 660 act to increase the read margin of the signal on the bitline pair. The read margin is the difference in signal level between the programmed cell and the non-programmed cell.

The boosted-low control signal de-selects the bitline pair 120. Thereby, power consumption is reduced, and the column select path gates 655, 660 switching speed is also reduced.

Thus, the column select driver circuit 665 of the present invention provides a level shifter able to efficiently switch at a high voltage. The efficient high voltage level shifter is used to drive the column select path gates 655, 660 at increased switching speeds. Furthermore, the read margin in the memory device is improved at low supply voltages due to the high voltage level shift of the column select driver circuit 665.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A decoder circuit comprising a path gate driver circuit, wherein the path gate driver circuit comprises:

a shunt stage, having a shunt stage control terminal coupled to a supply, and a shunt stage input terminal coupled to a control signal path;

a level shifter stage, having a first level shifter control terminal coupled to the control signal path, a second level shifter control terminal coupled to a shunt stage output terminal, a first level shifter stage input terminal coupled to a boost-low supply, and a second level shifter stage input terminal coupled to a boost-high supply;

a pull-up stage, having a pull-up stage control terminal coupled to a level shifter stage output terminal, and a pull-up stage input terminal coupled to the boost-high supply; and an output stage, having a first output stage control terminal coupled to the shunt stage output terminal and a pull-up stage output terminal, a second output stage control terminal coupled to the control signal path, a first output stage input terminal coupled to the boost-low supply, a second output stage input terminal coupled to the boost-high supply, and an output stage output terminal coupled to a boosted control signal path.

2. The path gate driver circuit according to claim 1, wherein the output stage output terminal provides a boosted control signal having a high state of substantially Vboost-high when the control signal is in a low state, and the output stage output terminal provides a boosted control signal having a low state of substantially Vboost-low when the control signal is in a high state.

3. The decoder circuit according to claim 2, further comprising:

a bitline;

a sense amplifier; and a path gate, wherein the path gate couples the sense amplifier to the bitline when the boosted control signal is in the high state, and the path gate isolates the sense amplifier from the bitline when the boosted control signal is in the low state.

4. The decoder circuit according to claim 2, further comprising:

a bitline; and a path gate, wherein the path gate couples a read drain voltage to the bitline when the boosted control signal is in the high state, and the path gate isolates the read drain voltage from the bitline when the boosted control signal is in the low state.

5. The decoder circuit according to claim 2, wherein the path gate driver circuit is adapted to reduce a signal drop in the decoder circuit.

6. The decoder circuit according to claim 2, wherein the path gate driver circuit is adapted to increase a read margin in the decoder circuit.

7. The path gate driver circuit according to claim 1, wherein the shunt stage comprises:

a first transistor of the n-type, adapted to selectively couple the control signal path to the second level shifter stage control terminal and the first output stage control terminal.

8. The path gate driver circuit according to claim 1, wherein the level shifter stage comprises:

a second transistor of the n-type, adapted to selectively couple the boost-low supply to the pull-up stage control terminal; and a third transistor of the p-type, adapted to selectively couple the boost-high supply to the pull-up stage control terminal.

9. The path gate driver circuit according to claim 8, wherein the second transistor provides a strong pull-down toward Vboost-low when the control signal is in a high state.

10. The path gate driver circuit according to claim 1, wherein the pull-up stage comprises:

a forth transistor of the p-type, adapted to selectively couple the boost-high supply to the first output stage control terminal and the second level shifter control terminal.

11. The path gate driver circuit according to claim 10, wherein the forth transistor provides a strong pull-up toward Vboost-high when the control signal is in a high state.

12. The path gate driver circuit according to claim 1, wherein the output stage comprises:

a fifth transistor of the p-type, adapted to selectively couple the boost-high supply to the boosted control signal path; and a sixth transistor of the n-type, adapted to selectively couple the boost-low supply to the boosted control signal path.

13. The path gate driver circuit according to claim 12, wherein the sixth transistor provides a strong pull-down toward Vboost-low when the control signal is in a high state.

14. A path gate driver circuit, comprising:

a first switching element having a first switching element control terminal coupled to a supply, and a first switching element input terminal coupled to a control signal path;

a second switching element having a second switching element control terminal coupled to the control signal path, and a second switching element input terminal coupled to a boost-low supply;

a third switching element having a third switching element control terminal coupled to a first switching element output terminal, and a third switching element input terminal coupled to a boost-high supply;

a forth switching element having a forth switching element control terminal coupled to a second switching element output terminal and a third switching element output terminal, and a forth switching element input terminal coupled to the boost-high supply;

a fifth switching element having a fifth switching element control terminal coupled to the first switching element output terminal and a forth switching element output terminal, a fifth switching element input terminal coupled to the boost-high supply, and a fifth switching element output terminal coupled to a boosted control signal path; and a sixth switching element having a sixth switching element control terminal coupled to the control signal path, a sixth switching element input terminal coupled to the boost-low supply, and a sixth switching element output terminal coupled to the boosted control signal path.

15. The path gate driver circuit according to claim 14, wherein the first switching element, second switching element, and sixth switching elements are n-type metal oxide silicon field effect transistors.

16. The path gate driver circuit according to claim 14, wherein the third switching element, fourth switching element, and fifth switching element are p-type metal oxide silicon filed effect transistors.

17. The path gate driver circuit according to claim 14, wherein the sixth switching element provides a strong pull-down path to the boost-low supply.

18. The path gate driver circuit according to claim 14, wherein the second switching element provides a strong pull-down path to the boost-low supply.

19. The path gate driver circuit according to claim 14, wherein the forth switching element provides a strong pull-up path to the boost-high supply.

20. The path gate driver circuit according to claim 14, wherein the boosted control signal is substantially at the boost-high supply level when the control signal is in a low state.

21. The path gate driver circuit according to claim 14, wherein the boosted control signal is substantially at the boost-low supply level when the control signal is in a high state.

22. A path gate driver circuit for driving a path gate, comprising:
- a first switching element adapted to provide a control signal at a third switching element input, and a fifth switching element input;
- a second switching element adapted to provide a strong pull-down path to a ground at a forth switching element input in response to a high state of the control signal;
- a third switching element adapted to provide a pull-up path to a boost-high supply at the forth switching element input in response to a low state of a first node signal, wherein the first node signal comprises a first switching element output and a forth switching element output;
- a forth switching element adapted to provide a strong pull-up path to the boost-high supply at the fifth switching element input and the third switching element input in response to a low state of a second node signal, wherein the second node signal comprises a second switching element output and a third switching element output;
- a fifth switching element adapted to provide a pull-up path to the boost-high supply at a fifth switching element output in response to a low state of the first node signal; and
- a sixth switching element adapted to provide a strong pull-down path to the ground at a sixth switching element output in response to the high state of the control signal.

23. The path gate driver circuit for driving a path gate according to claim 22, wherein the fifth switching element output and the sixth switching element output provide a boosted control signal having a high state of substantially Vboost-high when the control signal is in a low state, and the fifth switching element output and the sixth switching element output provide the boosted control signal having a low state of substantially ground when the control signal is in a low state.

24. The path gate driver circuit for driving a path gate according to claim 22, wherein the path gate driver circuit is adapted to reduce a signal drop across the path gate.

25. The path gate driver circuit for driving a path gate according to claim 22, wherein the path gate driver circuit is adapted to reduce switching time of the path gate.

* * * * *